United States Patent
Manickavasakam et al.

(10) Patent No.: US 7,623,404 B2
(45) Date of Patent: Nov. 24, 2009

(54) MEMORY DEVICE HAVING CONCURRENT WRITE AND READ CYCLES AND METHOD THEREOF

(75) Inventors: Sunitha Manickavasakam, Austin, TX (US); Ravindraraj Ramaraju, Round Rock, TX (US); Prashant U. Kenkare, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 387 days.

(21) Appl. No.: 11/561,449

(22) Filed: Nov. 20, 2006

(65) Prior Publication Data

US 2008/0117707 A1 May 22, 2008

(51) Int. Cl.
*G11C 7/00* (2006.01)
(52) U.S. Cl. .............. 365/226; 365/189.14; 365/233.1; 365/189.05
(58) Field of Classification Search ............ 365/230.06, 365/233.1, 230.08, 185.03, 189.05, 189.14
See application file for complete search history.

(56) References Cited

U.S. PATENT DOCUMENTS

| | | | |
|---|---|---|---|
| 5,610,872 A | 3/1997 | Toda | |
| 5,615,164 A | 3/1997 | Kirihata et al. | |
| 6,026,048 A * | 2/2000 | Wada | 365/230.08 |
| 6,032,220 A | 2/2000 | Martin et al. | |
| 6,757,799 B2 | 6/2004 | Martin et al. | |
| 2001/0048630 A1 | 12/2001 | Fujimoto et al. | |
| 2004/0004901 A1 | 1/2004 | Gieseke et al. | |
| 2004/0158688 A1* | 8/2004 | Rentschler et al. | 711/167 |
| 2005/0286327 A1 | 12/2005 | Ramaraju et al. | |

OTHER PUBLICATIONS

Sit et al., "A Four-Phase Handshaking Asynchronous Static RAM Design for Self-Timed Systems," IEEE Journal of Solid-State Circuits, vol. 34, No. 1, Jan. 1999, pp. 90-96.

* cited by examiner

*Primary Examiner*—Anh Phung
*Assistant Examiner*—Tha-O Bui

(57) ABSTRACT

A memory device includes a latch having an input to receive a bit value, an input to receive a clock signal, and an output to provide a latched bit value based on the clock signal. The memory device further includes a bit cell including a storage component, and a write row driver configured to enable write access to the bit cell to store the latched bit value at the storage component for a first phase and a second phase of a cycle of the clock signal, the second phase following the first phase, and a read row driver configured to disable read access to the bit cell for the first phase of the cycle of the clock signal and to enable read access to the bit cell for the second phase of the cycle of the clock signal.

20 Claims, 5 Drawing Sheets

MEMORY DEVICE HAVING CONCURRENT WRITE AND READ CYCLES AND METHOD THEREOF

FIELD OF THE DISCLOSURE

The present disclosure relates generally to memory devices and more particularly to storing and accessing data in memory devices.

BACKGROUND

Memory devices typically are composed of an array of bit cells, with each bit cell storing a corresponding bit of data. Each bit cell generally is configured as one or more transistors that store or retain an electrical charge or voltage representative of a bit value (e.g., a logic "0" or a logic "1"). In "register file"-type memory devices, each bit cell has a write input (composed of a write word line and one or more write bit lines) and a separate read input (composed of a read word line and one or more read bit lines) that can be independently accessed. In these types of memory devices, the robustness of a write access typically is determined based on the voltage levels of the bit cell storage nodes after the write word line input to the bit cell is deasserted. A write access typically is considered to be robust when there is rail-to-rail separation between the storage nodes; that is, one node is substantially close to the high voltage level (for example, $V_{DD}$), while the other node is substantially close to the low voltage level (for example, GND), thereby indicating stabilization of the voltage levels at the storage nodes. In operations whereby a write access to a bit cell is immediately followed by a read access to the same bit cell, such as during a write-verify access, if the storage nodes of a bit cell are not sufficiently stable by the deassertion of the write word line or the following assertion of the read word line, an incorrect bit value may be improperly sensed during the read access, thereby causing a functional failure for the memory device.

In many implementations, "register file"-type memory devices are configured such that write accesses occur during one phase of the clock cycle, while read accesses occur during the other phase of the clock cycle. In view of this arrangement, one conventional technique for reducing the likelihood of an erroneous read access following a write access to a bit cell includes slowing the clock signal so as to allow more time for the bit cell to stabilize during a write access before it is subjected to a following read access. However, slowing the clock results in a decrease in the number of possible accesses per unit time, thereby negatively affecting the performance of the memory device. Accordingly, an improved technique for performing write accesses to a memory device would be advantageous.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

Figure 1:
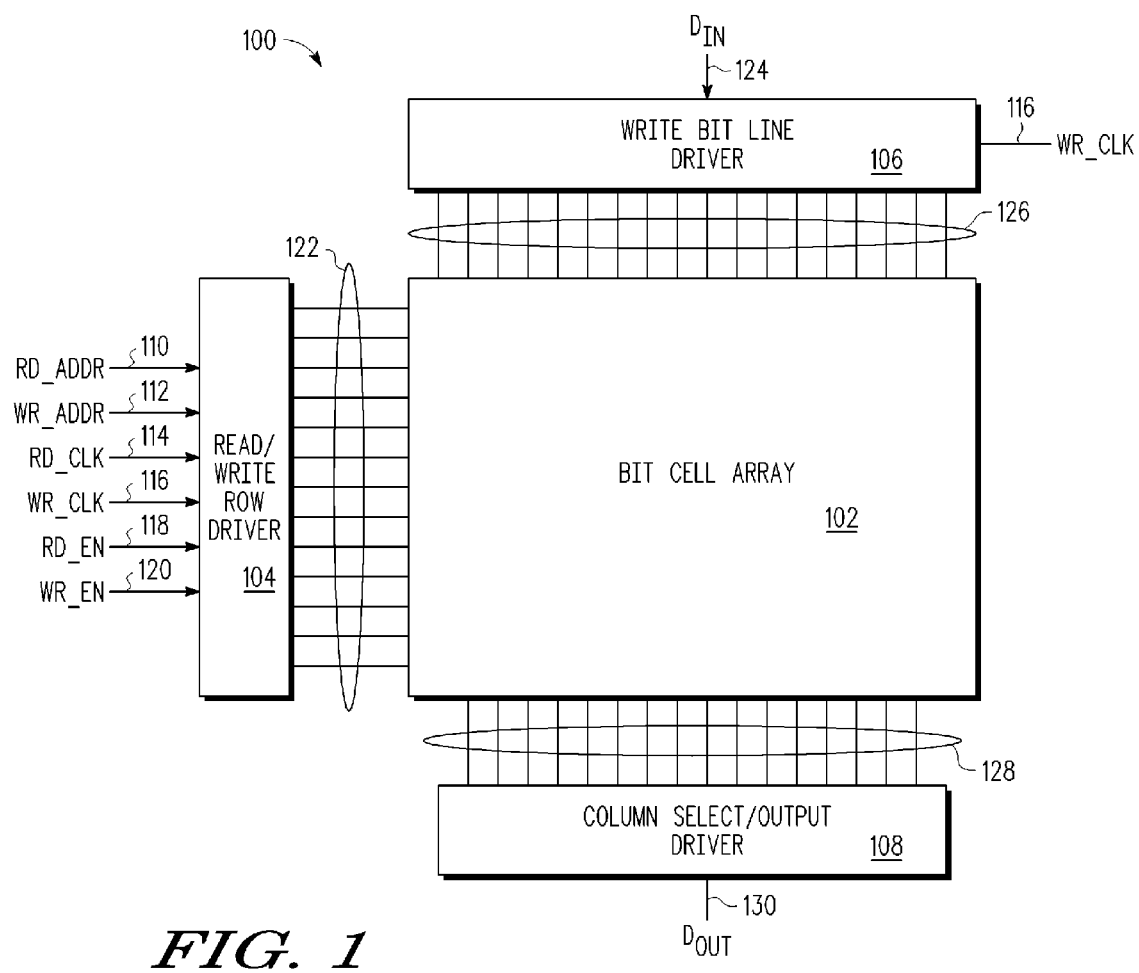
FIG. 1 is a diagram illustrating a memory device in accordance with at least one embodiment of the present disclosure.

In accordance with one aspect of the present disclosure, a method includes receiving, at a memory device, a bit value to be stored at a bit cell and latching the bit value to generate a latched bit value. The method further includes enabling, for a first phase and a second phase of a cycle of a clock signal, a write access to store the bit value at the bit cell based on the latched bit value, wherein the second phase follows the first phase, and enabling, for a second phase of the cycle of the clock signal, a read access to the bit cell.

In accordance with another aspect of the present disclosure, a memory device includes a latch having an input to receive a bit value, an input to receive a clock signal, and an output to provide a latched bit value based on the clock signal. The memory device further includes a bit cell comprising a storage component, and a write row driver configured to enable write access to the bit cell to store the latched bit value at the storage component for a first phase and a second phase of a cycle of the clock signal, the second phase following the first phase, and a read row driver configured to disable read access to the bit cell for the first phase of the cycle of the clock signal and to enable read access to the bit cell for the second phase of the cycle of the clock signal.

In accordance with yet another aspect of the present disclosure, a memory device includes a first latch having an input to receive a bit value, an input to receive a clock signal, and an output to provide a latched bit value based on the bit value for a first phase and a second phase of a cycle of the clock signal, wherein the second phase follows the first phase. The memory device further includes a second latch having an input configured to receive a write enable signal, an input to receive the clock signal, and an output to provide a latched write enable signal for the first phase and the second phase. The memory device further includes a write row driver having an input to receive the latched write enable signal, the write row driver configured to assert a write word line in response to the latched write enable signal having a first state and to deassert the write word line in response to the latched write enable signal having a second state. The memory device additionally includes a read row driver having an input to receive a read enable signal, the read row driver configured to assert a read word line in response to the read enable signal having a first state and to deassert the read word line in response to the read enable signal having a second state. The memory device further includes a bit cell array comprising a bit cell configured to selectively enable write access to the bit cell based on a state of the write word line and selectively enable read access to the bit cell based on a state of the read word line.

FIGS. 1-6 illustrate techniques for facilitating a write access and a read access to a bit cell concurrently. In one embodiment, a write access to a bit cell of a memory device is initiated for the first phase of a cycle of a clock signal and a read access to the bit cell is initiated for the following second phase of the cycle. Signals associated with the write access, such as a write address value, a write enable signal, a write data value, or a combination thereof, is set-up and held at the memory device based on edge events of the clock signal so as to enable the write access for both phases of the clock cycle, while also enabling the read access during the second phase of the clock cycle. Enabling the write access for the full cycle (or more than one phase of the cycle) can facilitate stabilization of the bit cell storage nodes while permitting the bit cell to be read in the same cycle, thereby reducing or eliminating a need to slow the clock signal for bit cell stabilization purposes.

FIG. 1 illustrates a memory device 100 in accordance with at least one embodiment of the present disclosure. The memory device 100 can be implemented as one or more separate integrated circuits (ICs), such as in an application specific integrated circuit (ASIC). Alternately, the memory device 100 can be implemented in another device, such as, for example, a microprocessor or microcontroller implemented as a system-on-a-chip (SOC). The memory device 100 can implement any of a variety of memory architectures, such as a dynamic random access memory (DRAM) architecture, a static random access memory (SRAM) architecture, a non-volatile architecture (e.g., flash memory), a magnetic random access memory (MRAM) architecture, and the like.

In the depicted example, the memory device 100 comprises a "register file"-type memory and includes a bit cell array 102, a read/write row driver 104, a write bit line driver 106, and a column select/output driver 108. The bit cell array 102 includes an array of bit cells logically arranged as a plurality of rows and columns. An example configuration of the bit cells of the bit cell array 102 is described in detail herein with reference to FIG. 5.

The read/write row driver 104 includes a plurality of inputs to receive signaling associated with read accesses and write accesses to the bit cell array 102. In the example of FIG. 1, these inputs include: a read address (RD_ADDR) signal 110 representing a read address value for a read access to a memory location (i.e., set of one or more bit cells) associated with the read address value; a write address signal (WR_ADDR) signal 112 representing a read address value for a write access to a memory location associated with the write address value; a read clock (RD_CLK) signal 114 to control the timing of the read access to the bit cell array 102; a write clock (WR_CLK) signal 116 to control the timing of the write access to the bit cell array 102; a read enable (RD_EN) signal 118 to enable and disable read accesses; and a write enable (WR_EN) signal 120 to enable and disable write accesses. In at least one embodiment, the RD_CLK signal 114 and the WR_CLK signal 116 are complementary signals derived from a common clock (CLK) signal.

The read/write row driver 104 further includes a plurality of outputs connected to the word lines 122 of the bit cell array 102, whereby the word lines 122 include a read word line (RWL) and a write word line (WWL) for each row of the bit cell array 102. For a read access, the read/write row driver 104 is configured to drive, or assert, the appropriate read word line of the word lines 122 based on RD_ADDR signal 110, the RD_CLK signal 114, and the RD_EN signal 118. For a write access, the read/write row driver 104 is configured to drive, or assert, the appropriate write word line of the word lines 122 based on the WR_ADDR signal 112, the WR_CLK signal 116, and the WR_EN signal 120. Example implementations of the read/write row driver 104 for write accesses and read access are described herein with reference to FIGS. 2 and 3, respectively.

The write bit line driver 106 includes an input to receive a write data value ($D_{IN}$) 124 and an input to receive the WR_CLK signal 116, and a plurality of outputs connected to write bit lines (WBLs) 126 of the bit cell array 102. The write bit line driver 106 includes a plurality of latches, each latch to receive and latch a corresponding bit of the write data value 124 based on the WR_CLK signal 116 and to provide the latched bit value to a corresponding write bit line of the bit cell array 102. An example implementation of the latches of the write bit line driver 106 is described in detail herein with reference to FIG. 4.

The column select/output driver 108 includes a plurality of inputs connected to read bit lines (RBLs) 128 of the bit cell array 102 and an output to provide a read data value ($D_{OUT}$) 130 representing the sequence of bit values sensed by the column select/output driver 108 from a row of bit cells via the read bit lines 128. The column select/output driver 108 can include one or more sense amplifiers and further can inputs to receive the RD_ADDR signal 110 and the WR_ADDR signal 112.

In operation, the timing of write accesses and read accesses to the memory device 100 is controlled by the WR_CLK signal 116 and the RD_CLK signal 114, respectively. For a write access, the read/write row driver 104 receives an asserted WR_EN signal 120 and a write address value represented by the WR_ADDR signal 112, latches the asserted WR_EN signal 120 and the write address value based on the WR_CLK signal 116, and asserts a write word line of the word lines 122 based on the latched write address value. Concurrently, the write data value 124 is provided to the write bit line driver 106, whereby it is latched by the write bit line driver 106 based on the WR_CLK signal 116 and the latched bits of the write data value 124 are provided to the corresponding write bit lines 126 of the bit cell array 102. During the assertion of the write word line, the bit cells associated with the write word line are configured to "store" the bit value received via a corresponding write bit line of the write bit lines 126.

The storage process for the bit cell typically entails driving a charge or voltage into a node of a storage component (such as, for example, cross-coupled inverters or other storage node configuration types) of the bit cell if the write bit value has a first state (e.g., a logic "1" value) or clearing a charge from a node of the storage component if the write bit value has a second state (e.g., a logic "0" value). It will be appreciated that this write process often is not instantaneous as it takes time for the storage component to switch between values (e.g., for the cross-coupled inverters to switch states). Thus, if a bit cell were to be read too soon following the initiation of a write access, the bit cell could be improperly read. Accordingly, in one embodiment, the read/write row driver 104 is configured to set up and hold the corresponding write word line for both phases of a cycle of the WR_CLK signal 116 and the write bit line driver 106 is configured to set up and hold the corresponding write bit values for both phases of the cycle of the WR_CLK signal 116 so that the write access to the row of bit cells (or portion of the row) is enabled for all, or nearly all, of the clock cycle, thereby allowing more time for the row of bit cells to sufficiently complete the storage process and thereby increasing the robustness of the write operation as compared to a conventional implementation whereby a write access is enabled for only one phase of a clock cycle.

For a read access, the read/write row driver 104 receives an asserted RD_EN signal 118 and a read address value represented by the RD_ADDR signal 110. Based on the read address value and the asserted RD_EN signal 118, the read/write row driver 104 asserts a read word line of the word lines 122 for one phase of the RD_CLK signal 114. Concurrently, the column select/output driver 108 is configured to sense the bit values stored at the row of bit cells enabled by the asserted read word line and provide the sensed bit values (or a portion thereof) as the read data value 130.

As described above, the RD_CLK signal 114, in one embodiment, is the complement of the WR_CLK signal 116, or vice versa, and thus the RD_CLK signal 114 and the WR_CLK signal 116 are derived from the same clock signal (not shown). Thus, for a write access-read access sequence to the same set of bit cells, the read/write row driver 104 is configured to enable the write access for both the first phase and the second phase of the clock signal using the edge events of the WR_CLK signal 116 (e.g., the rising edges) to delineate the phases of the clock signal, and configured to enable the read access for the second phase of the clock signal using the edge events of the RD_CLK signal 114 to delineate the phases of the clock signal. Thus, the storage process to the bit cells during the enabled write access is initiated prior to the read access of the bit cells, but due to the switching characteristics of the storage components of the bit cells, the bit value being stored can be stably read during the read access concurrent with the later phase of the write access.

Figure 2:
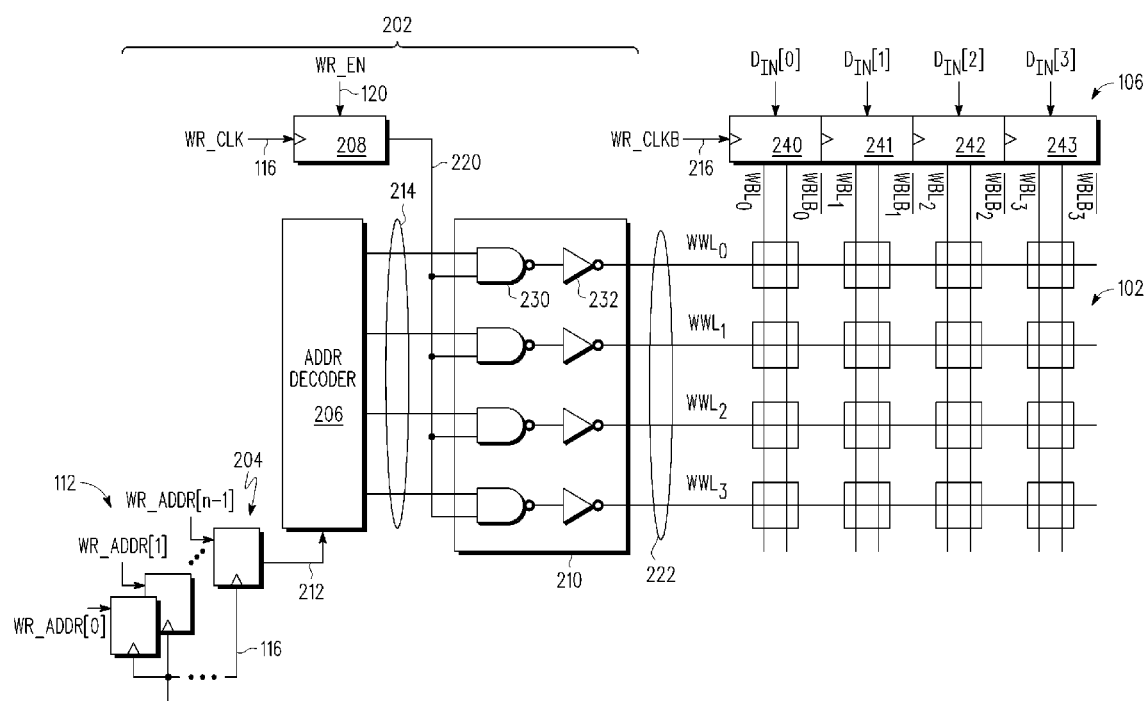
FIG. 2 is a diagram illustrating a write row driver and a write bit line driver having latched inputs in accordance with at least one embodiment of the present disclosure.

FIG. 2 illustrates an example implementation of a write row driver 202 of the read/write row driver 104 of FIG. 1 and the write bit line driver 106 of FIG. 1 in accordance with at least one embodiment of the present disclosure. In the depicted example, the write row driver 202 includes a write address latch bank 204, an address decoder 206, a write enable latch 208, and a write row selector 210. Further, for ease of illustration, the bit cell array 102 is illustrated as a matrix of bit cells arranged as four rows and four columns.

The write address latch bank 204 includes an input to receive the WR_ADDR signal 112, an input to receive a WR_CLKB signal 216, an output to provide a WR_ADDR_LATCHED signal 212, and a plurality of latches. The WR_CLKB signal 216 is derived from the WR_CLK signal 116, and in one embodiment the WR_CLKB signal 216 is the complement of the WR_CLK signal 116. Each latch has an input to receive the WR_CLKB signal 116, an input to receive a corresponding bit of the write address value (e.g., WR_ADDR[0:n-1]) represented by the WR_ADDR signal 112 and an output to latch a corresponding bit value of the WR_ADDR signal 112 based on the WR_CLKB signal 216. The write enable latch 208 includes an input to receive the WR_EN signal 120, an input to receive the WR_CLK signal 116, and an output to latch the WR_EN signal 120 (as WR_EN_LATCHED signal 220) based on the WR_CLK signal 116.

The address decoder 206 includes an input to receive the WR_ADDR_LATCHED signal 212 and row outputs 214, whereby the address decoder 206 is configured to assert a select one of the row outputs 214 based on the WR_ADDR_LATCHED signal 212. The write row selector 210 includes a plurality of inputs, each input connected to a corresponding one of the row outputs 214, and a plurality of outputs, each output connected to a corresponding one of the write word lines 222 (WWL0-WWL3) of the word lines 122 (FIG. 1). The write row selector 210 further includes logic to assert one of the write word lines 222 based on the assert state of the WR_EN_LATCHED signal 220 and the selected one of the row outputs 214. To illustrate, the write row selector 210 can include for each of the write word lines 222 a NAND gate 230 having an input connected to the output of the write enable latch 208 and an input connected to a corresponding one of the row outputs 214 and an inverter 232 having an input connected to the output of the NAND gate 230 and an output connected to a corresponding one of the write word lines 222 such that the corresponding write word line is asserted only when both the WR_EN_LATCHED signal 220 and the corresponding row output 214 are asserted.

The write bit line driver 106, in one embodiment, includes a plurality of latches, each latch having an input to receive a corresponding bit of the write bit value 124 (FIG. 1), an input to receive the WR_CLK signal 116, and an output connected to a corresponding write bit line to provide a corresponding latched write data value, whereby the latch is configured to latch the write bit value based on the WR_CLK signal 116. In the illustrated example, the write bit line driver 106 includes latches 240, 241, 242, and 243 to latch bits $D_{IN}[0]$, $D_{IN}[1]$, $D_{IN}[2]$, and $D_{IN}[3]$ of the write data value 124. Further, as illustrated, each of the latches 240, 241, 242, and 243 provides both the corresponding latched write bit value and its complement to the corresponding write bit line (write bit lines WBL0, WBL1, WBL2, and WBL3, respectively) and its complement write bit line (complement write bit lines WBLB0, WBLB1, WBLB2, and WBLB3, respectively).

In operation, the write address value represented by the WR_ADDR signal 112 is latched as WR_ADDR_LATCHED signal 212 between a first rising edge of the WR_CLK signal 116 and the following second rising edge of the WR_CLK signal 116. Likewise, the asserted WR_EN signal 120 is latched as the WR_EN_LATCHED signal 220 between the first and second rising edges of the WR_CLK signal 116. Further, the bits of the write data value 124 (FIG. 1) are set up and held with respect to the rising and falling edges, respectively, of the WR_CLKB signal 216. Alternately, these values can be held with respect to the opposite clock edges in the event that the logic is configured as negative-edge components.

The use of the WR_ADDR_LATCHED signal 212 and WR_EN_LATCHED signal 220 allows a selected one of the write word lines 222 to remain asserted for a full clock cycle. Additionally, the use of the latches 240, 241, 242, and 243 for the write data 124 allows the write bit lines 126 to hold the correct data value for a full clock cycle during the time when one of the write word lines 222 is asserted for the full cycle. This extended write operation helps to ensure that the bit cells have been completely written prior to deassertion of the selected word line.

Figure 3:
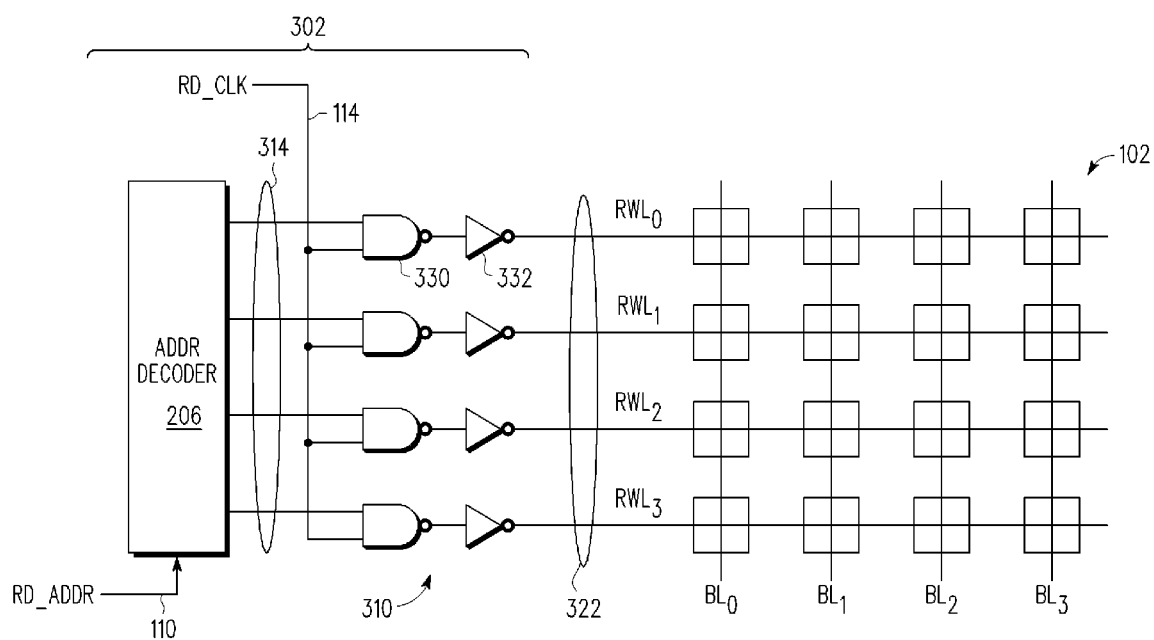
FIG. 3 is a diagram illustrating a read row driver in accordance with at least one embodiment of the present disclosure.

FIG. 3 illustrates an example implementation of a read row driver 302 of the read/write row driver 104 of FIG. 1 in accordance with at least one embodiment of the present disclosure. In the depicted example, the read row driver 302 includes the address decoder 206 and a read row selector 310. As with FIG. 2, the bit cell array 102 is depicted in FIG. 3 as a matrix of bit cells arranged as four rows and four columns for ease of illustration.

The address decoder 206 includes an input to receive the RD_ADDR signal 110 and row outputs 314, whereby the address decoder 206 is configured to assert a select one of the row outputs 314 based on the RD_ADDR signal 110. The read row selector 310 includes a plurality of inputs, each input connected to a corresponding one of the row outputs 314, and a plurality of outputs, each output connected to a corresponding one of the read word lines 322 (RWL0-RWL3) of the word lines 122 (FIG. 1). The read row selector 310 further includes logic to assert one of the read word lines 322 based on the RD_CLK 114 and the selected one of the row outputs 314. To illustrate, the read row selector 310 can include for each of the read word lines 322 a NAND gate 330 having an input to receive the RD_CLK signal 114 and an input connected to a corresponding one of the row outputs 314, and an inverter 332 having an input connected to the output of the NAND gate 330 and an output connected to a corresponding one of the read word lines 322 such that the corresponding read word line is asserted only when both RD_CLK signal 114 and the corresponding row output 314 are asserted.

In operation, the read address value represented by the RD_ADDR signal 110 is used by the address decoder 206 to select and assert one of the row outputs 314. Accordingly, when the RD_CLK signal 114 also is in an asserted state (e.g., a logic "1" or logic "high" state), the one of the read word lines 322 corresponding to the asserted row output 314 is asserted, thereby configuring the bit cells of the asserted row to output the stored value onto the corresponding bit line (bit lines BL0-BL3).

The RD_CLK signal 114, in one embodiment, is the complement of the WR_CLK signal 116. Accordingly, the RD_CLK signal 114 enters the asserted state for the second phase of the WR_CLK signal 116, and thus the read access is enabled during the second phase of the WR_CLK signal 116. As discussed above with reference to FIG. 2, due to the latching of the WR_ADDR_LATCHED signal 212, the WR_EN_LATCHED signal 220 and the latched write data value over both phases of a cycle of the WR_CLK signal 116, the latter phase of a write access and a read access can occur concurrently.

Figure 4:
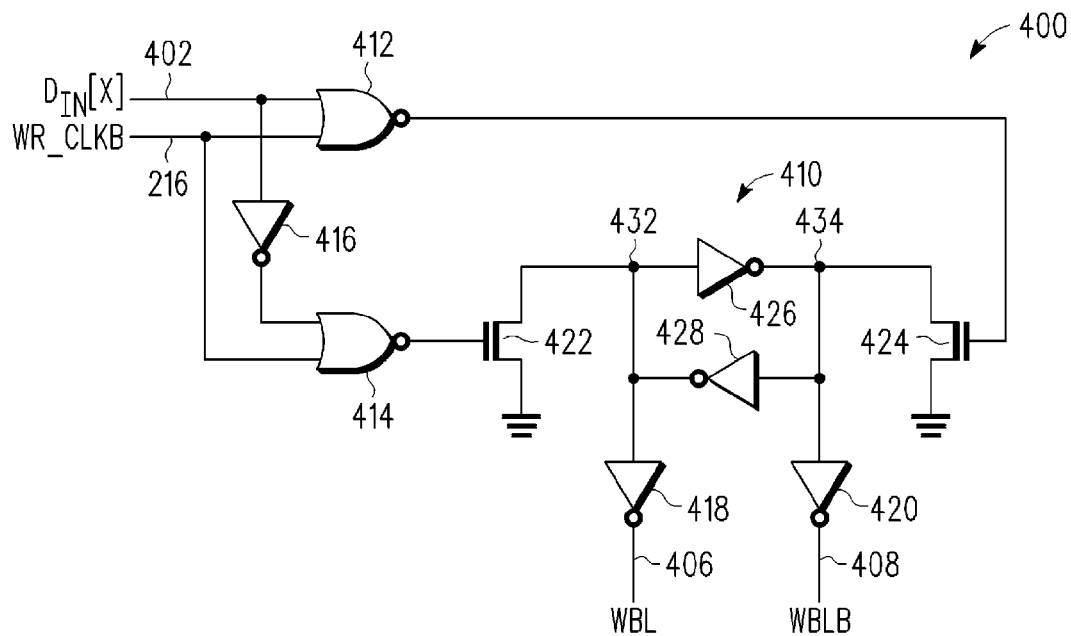
FIG. 4 is a circuit diagram illustrating a write bit line driver latch in accordance with at least one embodiment of the present disclosure.

FIG. 4 illustrates an example implementation of the latches of the write bit line driver 106 of FIG. 1 in accordance with at least one embodiment of the present disclosure. In the depicted example, the latch 400 includes an input 402 to receive a corresponding bit value of the write data value 124 (FIG. 1), an input 404 to receive the WR_CLKB signal 216 (FIG. 2), and outputs 406 and 408 connected to a corresponding write bit line and its complement write bit line (e.g., WBL and WBLB), respectively. The latch 400 further includes a storage component 410, NOR gates 412 and 414, inverters 416, 418, and 420, and n-type transistors 422 and 424. The storage component 410 is configured to store charge representative of a stored bit value and can be implemented as, for example, cross-coupled inverters 426 and 428.

The storage component 410 includes nodes 432 and 434. The transistor 422 includes a current electrode connected to the node 432, a current electrode connected to a voltage reference (e.g., GND), and a control electrode. The transistor 424 includes a current electrode connected to the node 434, a current electrode connected to a voltage reference (e.g. GND), and a control electrode. The NOR gate 412 includes an input connected to the input 402, an input connected to the input 404, and an output connected to the control electrode of the transistor 424. The inverter 416 includes an input connected to the input 402 and an output. The NOR gate 414 includes an input connected to the output of the inverter 416, an input connected to the input 404, and an output connected to the control electrode of the transistor 422. The inverter 418 includes an input connected to the node 432 and an output connected to the write bit line WBL via the output 406. The inverter 420 includes an input connected to the node 434 and an output connected to the write bit line WBLB via the output 408.

In operation, the falling edges of the WR_CLKB signal 216 result in the latching of the data value received at the input 402 such that the bit value received at the input 402 and its inverse are provided to the write bit line WBL and its complement write bit line WBLB, respectively, and these latched values remain stable between falling edges of the WR_CLKB signal 216.

Figure 5:
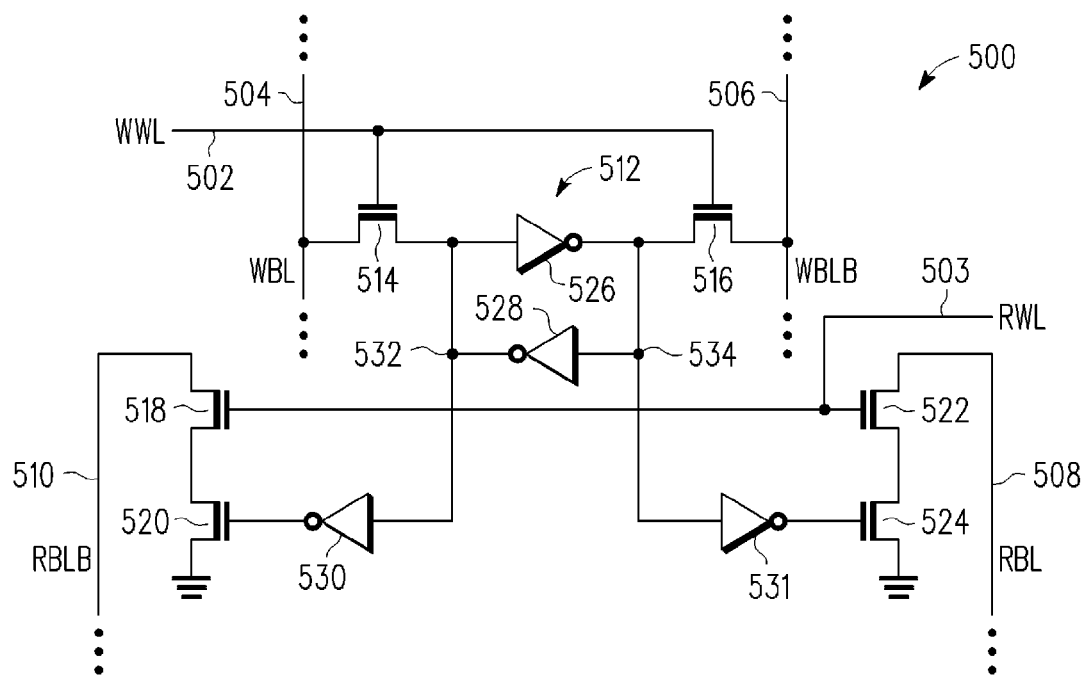
FIG. 5 is a circuit diagram illustrating a bit cell in accordance with at least one embodiment of the present disclosure.

FIG. 5 illustrates an example implementation of the bit cells of the bit cell array 102 of FIG. 1 in accordance with at least one embodiment of the present disclosure. In the depicted example, the bit cell 500 includes an input 502 connected to a corresponding write word line (WWL), an input 503 connected to a corresponding read word line (RWL), inputs 504 and 506 connected to a corresponding write bit line and its complement (WBL and WBLB), respectively, outputs 508 and 510 connected to a read bit line and its complement (RBL and RBLB), respectively, and a storage component 512. The bit cell 500 further includes n-type transistors 514, 516, 518, 520, 522, and 524. The storage component 512 is configured to store charge representative of a stored bit value and can be implemented as, for example, cross-coupled inverters 526 and 528. Depending on the logic arrangement of the column select/output driver 108 (FIG. 1), the bit cell 500 further can include inverters 530 and 531.

The storage component 512 includes nodes 532 and 534. The transistor 514 includes a control electrode connected to the input 502, a current electrode connected to the input 504, and a current electrode connected to the node 532. The transistor 516 includes a control electrode connected to the input 502, a current electrode connected to the input 506, and a current electrode connected to the node 534. The transistor 518 includes a control electrode connected to the input 503, a first current electrode connected to the output 510 and second current electrode. The transistor 520 includes a current electrode connected to a voltage reference (e.g., GND), a current electrode connected to the second current electrode of the transistor 518, and a control electrode. The transistor 522 includes a control electrode connected to the input 503, a first current electrode connected to the output 508 and second current electrode. The transistor 524 includes a current electrode connected to a voltage reference (e.g. GND), a current electrode connected to the second current electrode of the transistor 522, and a control electrode. In one embodiment, the node 532 is connected directly to the control electrode of the transistor 520 and the node 534 is connected directly to the control electrode of the transistor 524. In another embodiment, the node 532 is connected to the control electrode of the transistor 520 via the inverter 530 and the node 534 is connected to the control electrode of the transistor 524 via the inverter 531.

In operation, the bit cell 500 is configured to store a charge in the storage component 512 based on the bit value represented by the complementary states of the write bit line (WBL) and the complement write bit line (WBLB) when the write word line (WWL) is asserted during a write access. Nodes 532 and 534 respectively represent the stored bit value and the complement of the stored bit value. Representations of the values stored on node 532 and node 534 are respectively coupled to the outputs 510 and 508 during the assertion of the RWL (at input 503).

As discussed above, the storage component 512 can be implemented as, for example, cross-coupled inverters 526 and 528. Due to the transistor arrangement of the inverters 526 and 528, it will be appreciated that the nodes 532 and 534 do not instantaneously change logic states when a new bit value is to be stored in the storage component 512. Rather, the outputs of the inverters 526 and 528 each gradually approaches the high voltage reference (e.g., $V_{DD}$) or the low voltage reference (e.g., GND) and thus it can be beneficial to allow the storage process to continue for a full cycle of the write clock (WR_CLK signal 116, FIG. 1), rather than only one phase of the write clock cycle, so as to facilitate a robust write of the bit cell 500. However, while it may require more than one phase of the write clock cycle to sufficiently stabilize the storage component of the bit cell 500 for write purposes, the inverters 530 and 531, or alternately the logic of the column select/output driver 108, typically do not require that the outputs of the inverters 526 and 528 of the storage component 512 be fully at the high voltage reference or the low voltage reference to adequately sense the correct voltage at the nodes 532 and 534. Typically, the correct sensing of the stored value at the storage component 512 can be achieved when the nodes 532 and 534 are at a substantial portion of the corresponding high voltage reference or low voltage reference. Thus, a write access can be extended from one phase of a clock cycle to both phases of a clock cycle so as to facilitate a robust write operation of the bit cell 500 while still permitting a read access to the bit cell 500 during the latter phase of the clock cycle.

Figure 6:
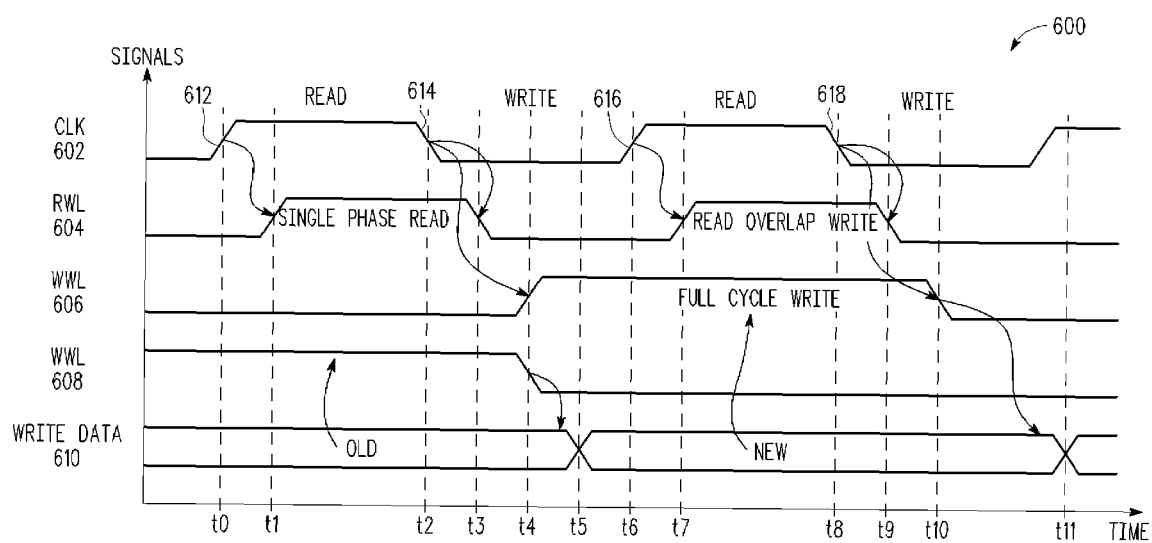
FIG. 6 is a timing diagram illustrating a concurrent write access and read access at a memory location of a memory device in accordance with at least one embodiment of the present disclosure.

FIG. 6 illustrates an example timing diagram 600 for memory accesses to a memory device in accordance with at least one embodiment of the present disclosure. For ease of reference, the timing diagram 600 is illustrated with reference to the examples of FIGS. 1-5.

The timing diagram 600 includes a clock (CLK) signal 602, a read word line (RWL) signal 604, a write word line (WWL) signal 606 for a first write word line, a write word line (WWL) signal 606 for a second write word line, and a write data signal 610. The CLK signal 602 represents a clock signal from which the WR_CLK signal 116 and the RD_CLK signal 114 are derived. In the illustrated example, read accesses are enabled when the CLK signal 602 is in a logic "1" state. Further, a delay is assumed between clock edge events and resulting events in the signals 604, 606, and 608.

Prior to time t0, the read/write row driver 104 has already asserted the WWL signal 608 such that the write data (identified as "OLD") of the write data signal 610 is in the process of being stored in the row of bit cells associated with the second word line. In response to edge event 612 (at time $t_0$) of the CLK signal 602, the read/write row driver 104 (FIG. 1) asserts the RWL signal 604 (at time $t_1$) and deasserts the RWL signal 604 (at time $t_3$) in response to the edge event 614 of the CLK signal 602 (at time $t_2$). While the RWL signal 604 is asserted (between times $t_1$ and $t_3$), read access is enabled for the row of bit cells associated with the RWL signal 604.

Further, in response to edge event 614 of the CLK signal 602, the read/write row driver 104 asserts the WWL signal 606 and deasserts the WWL signal 606 (at time $t_4$). In order to provide a sufficient hold time for the write operation using the WWL signal 608, the "OLD" write data is held by the write data signal 610 until time $t_5$, at which time the "NEW" write data is placed on the write data signal 610 for the write operation using the WWL signal 606. In response to the edge event 618 of the CLK signal 602 (at time $t_8$), the read/write row driver 104 deasserts the WWL signal 606 (at time $t_{10}$). Accordingly, write access to the row of bit cells associated with the WWL signal 606 is enabled for the time period between time $t_4$ and time $t_{10}$. In the illustrated embodiment, the set-up times for the "NEW" write data carried by the write data signal 610 permits the write bit line driver 106 (FIG. 1) to latch the bits of the write data signal 610 in response to the edge event of the clock signal 602 at time $t_6$ and the bit cells associated with the WWL signal 606 begin to store the corresponding latched bit value from the write data signal 610.

In response to edge event 616 of the CLK signal 602 (at time $t_6$), the read/write row driver 104 asserts the RWL signal 604 (at time $t_7$), and in response to the edge event 618 of the clock signal (at time $t_8$), the read/write row driver 104 deasserts the RWL signal 604 (at time $t_9$). Accordingly, while the RWL signal 604 is asserted between times $t_7$ and $t_9$, read access is enabled for the row of bit cells associated with the RWL signal 604, which is the same row of bit cells associated with the WWL signal 606 in this example. The read/write row driver 104 deasserts the RWL signal 604 and the WWL signal 606 at time $t_9$ and time $t_{10}$, respectively. In order to meet the hold time requirements of the bit cells associated with the second write word line, the "NEW" data is held on the write data signal 610 until time $t_{11}$.

Thus, as the timing diagram 600 illustrates, the write access to a row of bits is enabled between time $t_4$ and time $t_{10}$ and a read access to the same row of bits is enabled between time $t_7$ and time $t_9$. Thus, the write access has from time $t_4$ to time $t_7$ to sufficiently store the intended bit values before the read access commences concurrent with the write access between times $t_7$ and $t_9$.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

What is claimed is:

1. A method comprising:
   receiving, at a memory device, a first bit value to be stored at a first bit cell;
   latching the first bit value to generate a latched first bit value;
   enabling, for a first phase and a second phase of a first cycle of a clock signal, a write access to store the first bit value at the first bit cell based on the latched first bit value, wherein the second phase follows the first phase; and
   enabling, for the second phase of the first cycle of the clock signal, a read access to the first bit cell.

2. The method of claim 1, wherein enabling the write access comprises:
   determining a write word line associated with the first bit cell based on a write address value; and
   asserting the write word line in response to a first edge event of the clock signal, wherein the first bit cell is enabled to store a bit value in response to the write word line being asserted and wherein the first edge event indicates an initiation of the first phase of the first cycle of the clock signal; and
   deasserting the write word line in response to a second edge event of the clock signal, wherein the first bit cell is disabled from storing a bit value in response to the write word line being deasserted and wherein the second edge event indicates a termination of the second phase of the first cycle of the clock signal.

3. The method of claim 2, further comprising:
   latching the write address value to generate a latched write address value for the first cycle of the clock signal;
   wherein latching the first bit value comprises latching the first bit value for the first cycle of the clock signal.

4. The method of claim 2, wherein enabling the read access to the first bit cell comprises:
   determining a read word line associated with the read access based on a read address value associated with the read access;

asserting the read word line in response to a third edge event of the clock signal, wherein the first bit cell is enabled to output a bit value in response to the read word line being asserted and wherein the third edge event indicates an initiation of the second phase of the first cycle of the clock signal; and deasserting the read word line in response to the second edge event of the clock signal, wherein the first bit cell is disabled from outputting a bit value in response to the read word line being deasserted.

5. The method of claim 1, further comprising:
sensing the first bit value at the first bit cell during the read access.

6. The method of claim 1, further comprising:
receiving, at the memory device, a second bit value to be stored at a second bit cell;
latching the second bit value to generate a latched second bit value;
enabling, for a first phase and a second phase of a second cycle of the clock signal, a write access to store the second bit value at the second bit cell based on the latched second bit value, wherein the second phase follows the first phase; and
enabling, for the second phase of the second cycle of the clock signal, a read access to the second bit cell.

7. The method of claim 6, further comprising:
determining a first write word line associated with the first bit cell based on a first write address value;
asserting the first write word line in response to a first edge event of the clock signal, wherein the first bit cell is enabled to store a bit value in response to the first write word line being asserted and wherein the first edge event indicates an initiation of the first phase of the first cycle of the clock signal;
deasserting the first write word line in response to a second edge event of the clock signal, wherein the first bit cell is disabled from storing a bit value in response to the first write word line being disabled and wherein the second edge event indicates a termination of the second phase of the first cycle of the clock signal;
determining a second write word line associated with the second bit cell based on a second write address value;
asserting the second write word line in response to a third edge event of the clock signal, wherein the second bit cell is enabled to store a bit value in response to the second write word line being asserted and wherein the third edge event indicates an initiation of the first phase of the second cycle of the clock signal; and
deasserting the second write word line in response to a fourth edge event of the clock signal, wherein the second bit cell is disabled from storing a bit value in response to the second write word line being deasserted and wherein the fourth edge event indicates a termination of the second phase of the second cycle of the clock signal.

8. A memory device comprising:
a first latch having an input to receive a bit value, an input to receive a clock signal, and an output to provide a latched bit value based on the clock signal;
a bit cell comprising a storage component;
a write row driver configured to enable write access to the bit cell to store the latched bit value at the storage component for a first phase and a second phase of a cycle of the clock signal, the second phase following the first phase; and
a read row driver configured to disable read access to the bit cell for the first phase of the cycle of the clock signal and to enable read access to the bit cell for the second phase of the cycle of the clock signal.

9. The memory device of claim 8, further comprising:
a second latch having an input to receive a write enable signal, an input to receive the clock signal, and an output to provide a latched write enable signal for the first phase and the second phase of the cycle of the clock signal; and
wherein the write row driver is configured to enable write access to the bit cell in response to the latched write enable signal having a first state and disable write access to the bit cell in response to the latched write enable signal having a second state.

10. The memory device of claim 9, wherein the read row driver comprises an input to receive a read enable signal, the read enable signal having the second state for the first phase of the cycle of the clock signal and having the first state for the second phase of the cycle of the clock signal, and wherein the read row driver is configured to disable read access to the bit cell in response to the read enable signal having the second state and to enable read access to the bit cell in response to the read enable signal having the first state.

11. The memory device of claim 9, wherein the read row driver comprises an input to receive a read enable signal, the read enable signal having the second state for the first phase of the cycle of the clock signal and having the first state for the second phase of the cycle of the clock signal, and wherein the read row driver is configured to disable read access to the bit cell in response to the read enable signal having the first state and to enable read access to the bit cell in response to the read enable signal having the second state.

12. The memory device of claim 8, wherein the bit cell comprises a first input coupled to a write word line, a second input coupled to a read word line, a third input coupled to the output of the first latch, and an output, wherein the bit cell is configured to store to the storage component a bit value at the third input in response to the write word line being asserted and to provide a bit value stored at the storage component to the output in response to the read word line being asserted.

13. The memory device of claim 12, wherein:
the write row driver is configured to assert the write word line for the first phase and the second phase; and
the read row driver is configured to deassert the read word line for the first phase and to assert the read word line for the second phase.

14. The memory device of claim 13, further comprising:
a latch to receive a write address value associated with the first bit cell, an input to receive the clock signal, and an output to provide a latched write address value; and
wherein the write row driver is configured to select the write word line from a plurality of write word lines based on the latched write address value.

15. The memory device of claim 12, wherein the bit cell comprises:
a first inverter having an input connected to a first node and an output connected to a second node;
a second inverter having an input connected to the second node and an output connected to the first node, wherein the storage component comprises the first inverter and the second inverter;
a first transistor comprising a first current electrode connected to the third input, a second current electrode connected to the first node, and a control electrode connected to the write word line;
a second transistor comprising a first current electrode connected to a read bit line, a second current electrode, and a control electrode connected to the read word line; and a third transistor comprising a first current electrode connected to a voltage reference, a second current electrode connected to the second current electrode of the second transistor, and a control electrode connected to the second node.

16. The memory device of claim 15, wherein the bit cell further comprises:
a third inverter comprising an input coupled to the second node and an output coupled to the control electrode of the third transistor, wherein the control electrode of the third transistor is coupled to the second node via the third inverter.

17. The memory device of claim 8, further comprising an array of bit cells including the bit cell, each of the bit cells of the array including a storage component.

18. A memory device comprising:
a first latch having an input to receive a bit value, an input to receive a clock signal, and an output to provide a latched bit value based on the bit value for a first phase and a second phase of a cycle of the clock signal, wherein the second phase follows the first phase;
a second latch having an input configured to receive a write enable signal, an input to receive the clock signal, and an output to provide a latched write enable signal for the first phase and the second phase;
a write row driver having an input to receive the latched write enable signal, the write row driver configured to assert a write word line in response to the latched write enable signal having a first state and to deassert the write word line in response to the latched write enable signal having a second state;
a read row driver having an input to receive a read enable signal, the read row driver configured to assert a read word line in response to the read enable signal having a first state and to deassert the read word line in response to the read enable signal having a second state; and
a bit cell array comprising a bit cell configured to selectively enable write access to the bit cell based on a state of the write word line and selectively enable read access to the bit cell based on a state of the read word line.

19. The memory device of claim 18, further comprising:
a second latch to receive a write address value associated with the bit cell, an input to receive the clock signal, and an output to provide a latched write address value; and
wherein the write row driver is configured to select the write word line from a plurality of write word lines based on the latched write address value.

20. The memory device of claim 18, wherein the bit cell comprises a storage component, a first input coupled to the write word line, a second input coupled to the read word line, a third input coupled to the output of the first latch, and an output, and wherein the bit cell is configured to store to the storage component a bit value at the third input in response to the write word line being asserted and to provide a bit value stored at the storage component to the output in response to the read word line being asserted.

* * * * *

UNITED STATES PATENT AND TRADEMARK OFFICE
CERTIFICATE OF CORRECTION

| | | |
|---|---|---|
| PATENT NO. | : 7,623,404 B2 | |
| APPLICATION NO. | : 11/561449 | |
| DATED | : November 24, 2009 | |
| INVENTOR(S) | : Sunitha Manickavasakam et al. | |

It is certified that error appears in the above-identified patent and that said Letters Patent is hereby corrected as shown below:

Title Page, Item (57), please change "including" to --comprising--

Signed and Sealed this
Seventeenth Day of May, 2011

David J. Kappos
*Director of the United States Patent and Trademark Office*